United States Patent
Lee et al.

(10) Patent No.: US 7,489,188 B2
(45) Date of Patent: Feb. 10, 2009

(54) INPUT MATCHING APPARATUS AND METHOD FOR POWER AMPLIFIER USING DELTA-SIGMA MODULATED SIGNAL

(75) Inventors: Dong-Geun Lee, Goyang-si (KR); Bum-Man Kim, Pohang-si (KR); Jeong-Hyeon Cha, Pohang-si (KR)

(73) Assignees: Samsung Electronics Co., Ltd (KR); Postech Foundation (KR)

( * ) Notice: Subject to any disclaimer, the term of this patent is extended or adjusted under 35 U.S.C. 154(b) by 243 days.

(21) Appl. No.: 11/487,200

(22) Filed: Jul. 14, 2006

(65) Prior Publication Data

US 2007/0013441 A1    Jan. 18, 2007

(30) Foreign Application Priority Data

Jul. 15, 2005    (KR) .................... 10-2005-0064342

(51) Int. Cl.
*H03F 3/38* (2006.01)

(52) U.S. Cl. ........................................ 330/10; 330/107
(58) Field of Classification Search ................... 330/10, 330/107; 375/238; 332/109
See application file for complete search history.

(56) References Cited

U.S. PATENT DOCUMENTS

| | | | | |
|---|---|---|---|---|
| 6,940,343 | B2 | 9/2005 | Heubi et al. | 330/10 |
| 7,248,193 | B2 * | 7/2007 | Fujimoto | 330/10 |
| 7,265,617 | B2 * | 9/2007 | Ohkuri | 330/10 |

FOREIGN PATENT DOCUMENTS

| | | |
|---|---|---|
| JP | 10-322146 | 12/1998 |
| JP | 11-346121 | 12/1999 |
| KR | 1020040082717 | 9/2004 |
| KR | 1020040092291 | 11/2004 |

* cited by examiner

*Primary Examiner*—Khanh V Nguyen
(74) *Attorney, Agent, or Firm*—The Farrell Law Firm, PC

(57) ABSTRACT

An apparatus and method amplifies a delta-sigma modulated signal and delivers the amplified signal to a power amplifier without distortion in a communication system. The apparatus receives a delta-sigma modulated signal, phase-delays the received delta-sigma modulated signal by a multiple of 360° for a bandwidth of the delta-sigma modulated basic signal, and amplifies the phase-delayed signal, facilitating implementation of a high-efficiency delta-sigma modulation-based amplification system.

17 Claims, 4 Drawing Sheets

INPUT MATCHING APPARATUS AND METHOD FOR POWER AMPLIFIER USING DELTA-SIGMA MODULATED SIGNAL

PRIORITY

This application claims the benefit under 35 U.S.C. § 119 (a) of an application entitled "Input Matching Apparatus and Method for Power Amplifier Using Delta-Sigma Modulated Signal" filed in the Korean Intellectual Property Office on Jul. 15, 2005 and assigned Ser. No. 2005-64342, the contents of which are incorporated herein by reference.

BACKGROUND OF THE INVENTION

1. Field of the Invention

The present invention relates generally to an amplification system for mobile communication, applied to a communication system, and in particular, to a Class-S amplifier system for efficiently amplifying a signal having a high Peak to Average Power Ratio (PAPR) in a communication system.

2. Description of the Related Art

Generally, power amplifiers used in a communication system are identified according to their classes, and the classes are defined in light of operation duration and a bias current of an output device. In that light, power amplifiers are classified as Class A, Class B, Class C, Class AB, Class F, and Class S. Each of the classes of the power amplifiers will be described in brief hereinbelow. A power amplifier whose operating point is put on the center of the bias is classified as Class A, and a power amplifier whose operating point is put on a 0V (zero volt)-bias is classified as Class B. A power amplifier whose operating point is put between Class A and Class B is classified as Class AB, and a power amplifier in which harmonic matching is added to an output matching stage is classified as Class F. Finally, a power amplifier that amplifies an input pulse signal in the form of a pulse is classified as Class S.

Herein, a description will be made of a Class-S system among the amplification systems of the various classes, and a Class-S amplifier used in the Class-S system.

The Class-S amplifier system converts a Radio Frequency (RF) signal into an RF pulse signal using a delta-sigma modulator. The delta-sigma modulated signal is amplified into an RF pulse signal using a power amplifier operating in a switching mode. Subsequently, the amplified signal is restored to its original signal after a switching harmonic component is removed therefrom through a band-pass filter. In this case, the power amplifier, as it operates in the switching mode, theoretically has an efficiency of 100%. In addition, a nonlinear component generated by the delta-sigma modulator and the RF amplifier is removed through a separate linearizer.

With reference to FIG. 1, a detailed description will now be made of a structure of the Class-S amplification system.

FIG. 1 is a block diagram schematically illustrating a structure of a Class-S system using a general band-pass delta-sigma modulator.

Referring to FIG. 1, the general Class-S system includes a delta-sigma modulator 101, and a Class-S amplifier 107 composed of a power amplifier 103, and a band-pass filter 105.

The delta-sigma modulator 101 converts an input RF signal into an RF pulse signal using delta-sigma modulation, and outputs the RF pulse signal to the power amplifier 103. The power amplifier 103 operating in the switching mode amplifies the RF pulse signal received from the delta-sigma modulator 101 to a required level set in the system, and outputs the amplified RF pulse signal to the band-pass filter 105. The band-pass filter 105 removes a switching harmonic component included in the received amplified RF pulse signal to restore the RF pulse signal to its original signal. In this case, the power amplifier 103, as it operates in the switching mode, theoretically has an efficiency of 100%. Although not illustrated in the drawing, the Class-S system can include a separate linearizer for removing a nonlinear component generated by the delta-sigma modulator 101 and the power amplifier 103.

In order to generate the RF pulse signal, the conventional amplification system uses an over-sampling Analog-to-Digital Converter (ADC) such as the band-pass delta-sigma modulator. However, in the common mobile communication system, an RF signal has a frequency of 800 MHz or higher. Therefore, the conventional amplification system undesirably needs a band-pass delta-sigma modulator of 4-times over-sampling, i.e. over-sampling of about 3.2 GHz. For example, for a band of the IMT-2000 communication system, there is need for a fast band-pass delta-sigma modulator of about 8 GHz or higher.

In addition, the switching-mode power amplifier 103 should undesirably operate at up to 5 times the input RF frequency, i.e. have a broadband characteristic, for accurate amplification of the RF pulse signal output from the delta-sigma modulator 101. In other words, for a band of the IMT-2000 system, there is a need for a switching-mode power amplifier operating at about 10 GHz. However, it is difficult to actually implement the fast band-pass delta-sigma modulator and the switching-mode power amplifier, and they are expensive. In addition, it is also hard to actually implement a method of matching an input impedance of the power amplifier for the broadband input signal.

Aside from the block diagram of the power amplification system using the delta-sigma modulator, FIG. 1 shows signal flow diagrams generated at outputs of respective blocks, i.e. shows a signal flow in frequency and time domains.

As illustrated in FIG. 1, the delta-sigma modulator 101 converts a random input signal into a Pulse Width Modulation (PWM) signal having a constant envelope, generating quantization noises at an outer band of the signal. The power amplifier 103 amplifies the intact delta-sigma modulated signal at high efficiency. The power amplifier 103 performs linear amplification on the output signal of the delta-sigma modulator 101, having the constant envelope. To achieve high efficiency, the power amplifier 103 may be a Class-F amplifier.

Ideally, the Class-F amplifier has an efficiency of 100%. Therefore, the band-pass filter 105 receives the output signal of the power amplifier 103, and suppresses noises at the outer band of the signal to extract only the amplified original signal. One of the most important considerations in the amplification system is to deliver the delta-sigma modulated broadband signal to the power amplifier without distortion.

In order to increase a Signal-to-Noise Ratio (SNR), the conventional Class-S system using the delta-sigma modulator converts, in the time domain, a pulse wave into a signal having a bandwidth much broader than that of the original signal in the frequency band using an over-sampling technique and a noise shaping technique. In this case, if a baseband delta-sigma modulator is used, the broadband signal should be delivered from a digital Intermediate Frequency (IF) stage to the power amplifier via an RF transceiver without distortion. In addition, if the band-pass delta-sigma modulator is used, the broadband signal should be delivered from an output of the delta-sigma modulator to the power amplifier without distortion.

Although there is a theoretical description of a method for delivering transmission signals to the power amplifier without distortion, the conventional Class-S system does not present a detailed implementation method thereof and the possible problems occurring when actually implemented. That is, although implementation of the delta-sigma modulator and the power amplifier is possible, there is no proposed solution for combining them and reducing distortion of the signals delivered to the power amplifier.

That is, the conventional amplification system using the delta-sigma modulator has no scheme capable of delivering the delta-sigma modulated constant envelope signal to the power amplifier without distortion. Therefore, the power amplifier receives a signal not having a constant envelope. As a result, the power amplifier decreases in efficiency, for linear power amplification, causing deterioration of the entire performance of the delta-sigma modulation system.

SUMMARY OF THE INVENTION

It is, therefore, an object of the present invention to provide an apparatus and method capable of applying a delta-sigma modulator to an amplifier system for communication.

It is another object of the present invention to provide an apparatus and method capable of delivering a signal having a broad bandwidth due to delta-sigma modulation to a power amplifier without distortion.

It is further another object of the present invention to provide an apparatus and method for generating a signal having a constant envelope using a delta-sigma modulator in a communication system.

It is yet another object of the present invention to provide an apparatus and method capable of improving performance of a power amplifier by applying a signal having a constant envelope to an amplification system for communication.

It is still another object of the present invention to provide an apparatus and method capable of providing a high-efficiency power amplification system by delivering an output signal of a delta-sigma modulator to a power amplifier without distortion in a communication system.

According to one aspect of the present invention, there is provided an apparatus for power amplification in a communication system. The apparatus includes a power amplifier for receiving a delta-sigma modulated signal, and amplifying the delta-sigma modulated signal after a predetermined phase delay.

According to another aspect of the present invention, there is provided a method for power amplification in a communication system. The method includes receiving a delta-sigma modulated signal; phase-delaying the delta-sigma modulated signal; and power-amplifying the phase-delayed signal.

According to further another aspect of the present invention, there is provided an apparatus for power amplification in a communication system. The apparatus includes a phase compensation circuit for receiving a delta-sigma modulated signal, and applying a first phase delay to the delta-sigma modulated signal; and an input matching circuit for receiving the first phase delay-applied signal, and applying a second phase delay to the first phase delay-applied signal to output a signal for power amplification.

According to yet another aspect of the present invention, there is provided a method for power amplification in a communication system. The method includes receiving a delta-sigma modulated signal; applying a first phase delay to the delta-sigma modulated signal; and applying a second delay to the first phase delay-applied signal and amplifying the second phase delay-applied signal.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF PREFERRED EMBODIMENTS

Preferred embodiments of the present invention will now be described in detail with reference to the annexed drawings. In the following description, a detailed description of known functions and configurations incorporated herein has been omitted for clarity and conciseness.

The present invention provides a Class-S amplifier system including a delta-sigma modulator, a power amplifier operating in a switching mode, and a band-pass filter for recovering an original signal, to efficiently amplify a signal having a high Peak to Average Power Ratio (PAPR).

In particular, the present invention provides an input matching scheme capable of delivering a signal delta-sigma modulated by a delta-sigma modulator to a power amplifier without distortion, by additionally constructing a phase compensation circuit like an aliasing line for preventing an aliasing effect, along with broadband input matching in the Class-S amplifier system.

Figure 2:
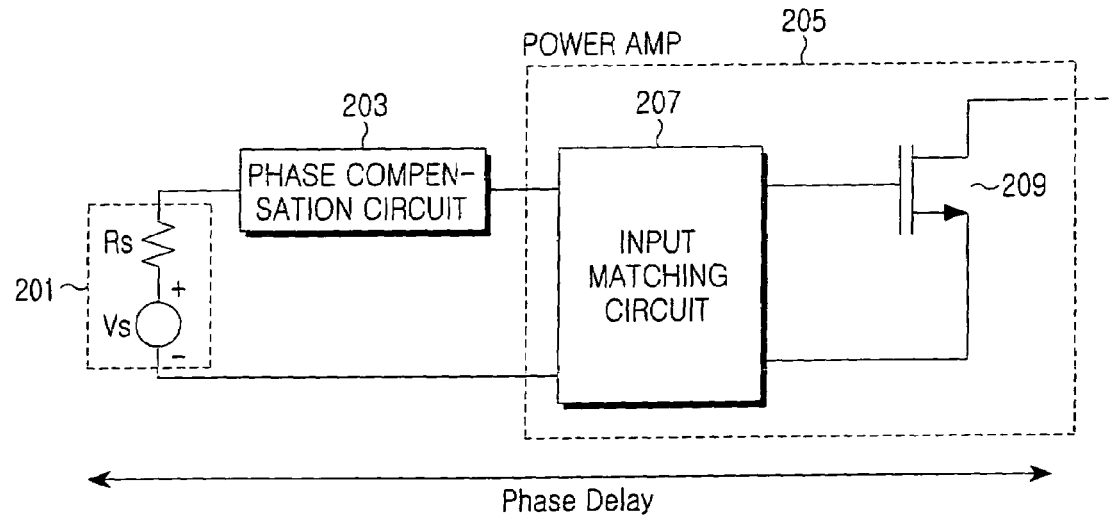
FIG. 2 is a diagram schematically illustrating an input matching structure of a power amplification system according to the present invention.

With reference to FIG. 2, a description will now be made of an exemplary scheme for designing a high-efficiency amplification system using a delta-sigma modulator. FIG. 2 is a diagram schematically illustrating an input matching structure of a power amplification system according to the present invention.

Referring to FIG. 2, the amplification system according to the present invention includes a source device 201, a phase compensation circuit 203, and a power amplifier 205. The power amplifier 205 includes an input matching circuit 207 and a transistor 209. The source device 201 may also be constructed in the delta-sigma modulator 101 shown in FIG. 1.

Figure 1:
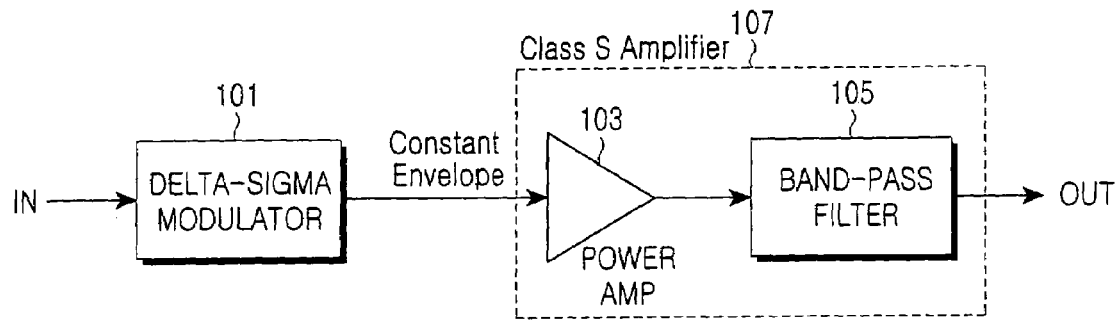
FIG. 1 is a block diagram schematically illustrating a structure of a Class-S system using a general band-pass delta-sigma modulator.

The present invention, shown in FIG. 2, shows a structure for an input matching method in which the source device 201 receives the signal delta-sigma modulated by the delta-sigma modulator 101 of FIG. 1, and delivers the input signal to an input node of the transistor 209 in the power amplifier 205 without distortion.

The overall signal flow shown in FIG. 2 is equal to that of FIG. 1. However, the conventional technology of FIG. 1 cannot present the combining condition of the delta-sigma modulator 101 and the power amplifier 103 for implementing the signal flow proposed in the present invention. Therefore, the present invention provides a structure capable of delivering an output of the delta-sigma modulator, i.e. an output of the source device 201, to the power amplifier 205 without distortion as shown in FIG. 2.

As illustrated in FIG. 2, the amplification system according to the present invention includes the broadband input matching circuit 207 to deliver the signal delta-sigma modulated by the delta-sigma modulator to an input node of the transistor 209 in the power amplifier 205 without distortion. In addition, the present invention includes the phase compensation circuit 203 together with the input matching circuit 207. That is, the interference between the basic signal and the harmonic signal due to the delta-sigma modulation may cause an aliasing effect that distorts the original constant envelope signal. In order to solve this problem, the present invention additionally includes the phase compensation circuit 203 having a specific length. In other words, the phase compensation circuit 203 is additionally inserted to remove the aliasing due to a phase delay, and can be implemented with one transmission line. Commonly, the power amplifier receiving the general narrowband signal as an input signal has no need to take the phase delay into account, so the phase delay of the input matching circuit 207 is irrespective of its performance. However, when the amplification system using the delta-sigma modulator receives the broadband signal such as the delta-sigma modulated signal, as its input signal, it should take the phase delay into account in order to avoid distortion of the signal.

Therefore, because the phase delay of the input matching circuit 207 is not restricted to a particular value, it is necessary to construct the phase compensation circuit 203 for achieving a particular phase delay. That is, the phase compensation circuit 203 of the present invention performs the above function.

Although the present invention uses an aliasing line as the phase compensation circuit 203 by way of example, it can also use other transmission lines such as a coaxial line or a micro-strip line instead of the aliasing line. Alternatively, the phase compensation circuit 203 can be equivalently replaced by a lumped component as well as the transmission line.

Alternatively, it is also possible to design the input matching circuit 207 at the initial design stage such that it has a particular phase delay, without separately constructing the phase compensation circuit 203 such as the aliasing line. In this case, the input matching circuit 207 can include the phase compensation circuit 203 therein to perform the above function.

Next, it is possible to deliver the constant envelope signal to an input end of the transistor 209 without distortion, by matching the phase delay for a combination of the phase compensation circuit 203 and the input matching circuit 207 for the transistor 209 to a multiple (360°×n degree, where n is an integer) of 360° for a bandwidth of the delta-sigma modulated basic signal. Therefore, the present invention can implement a high-performance amplification system.

Figure 3A:
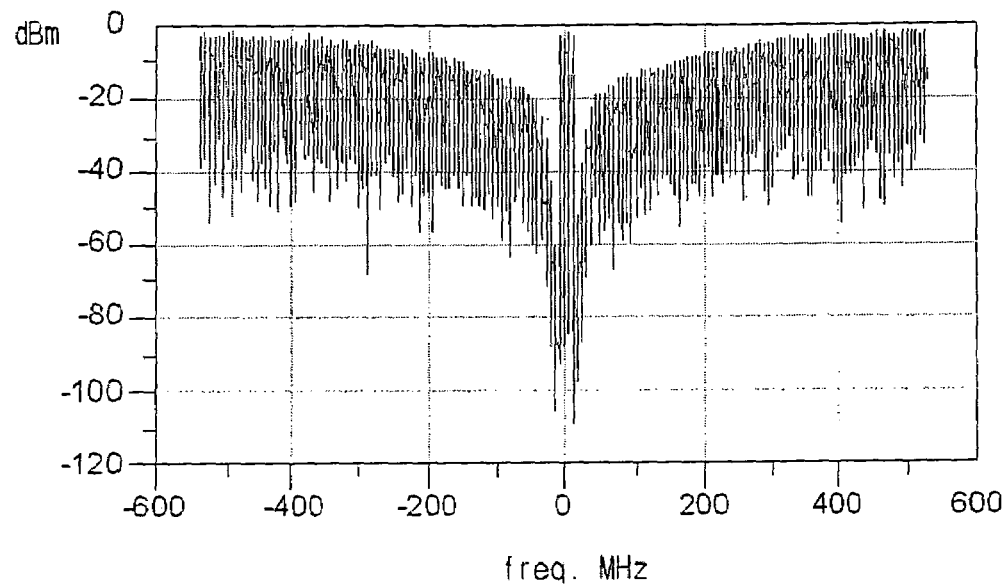
FIGS. 3A to 3C are diagrams illustrating frequency and time domain characteristics of an input signal to a power amplifier based on a phase delay in a power amplification system according to the present invention.
Figure 3A:
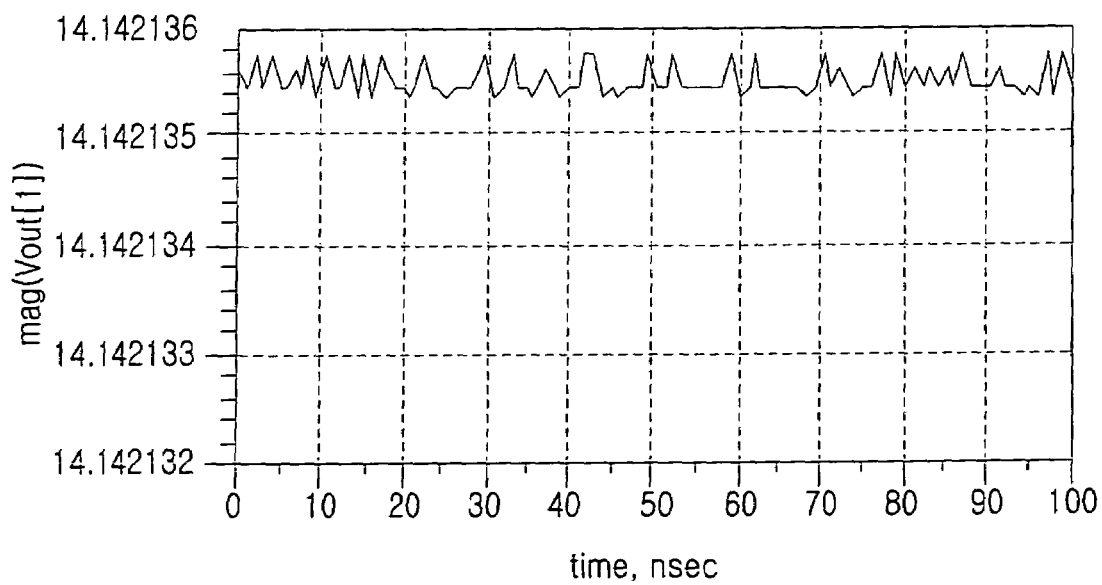
Figure 3B:
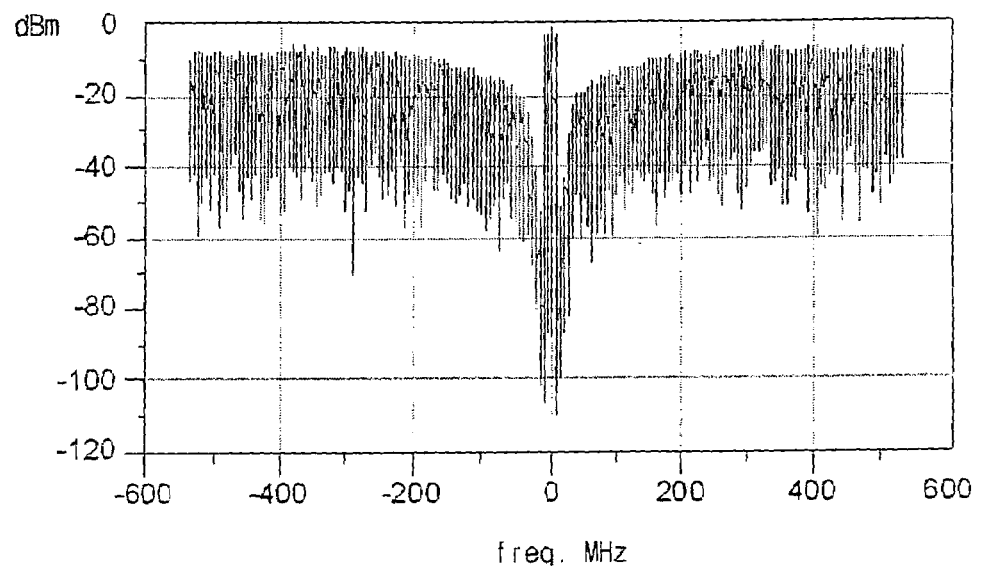
Figure 3B:
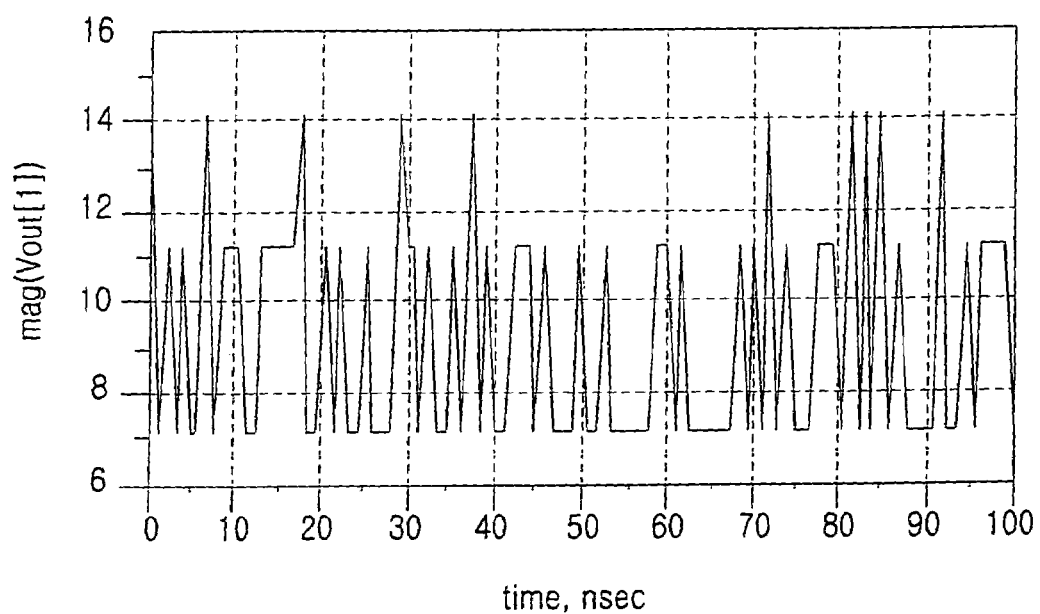
Figure 3C:
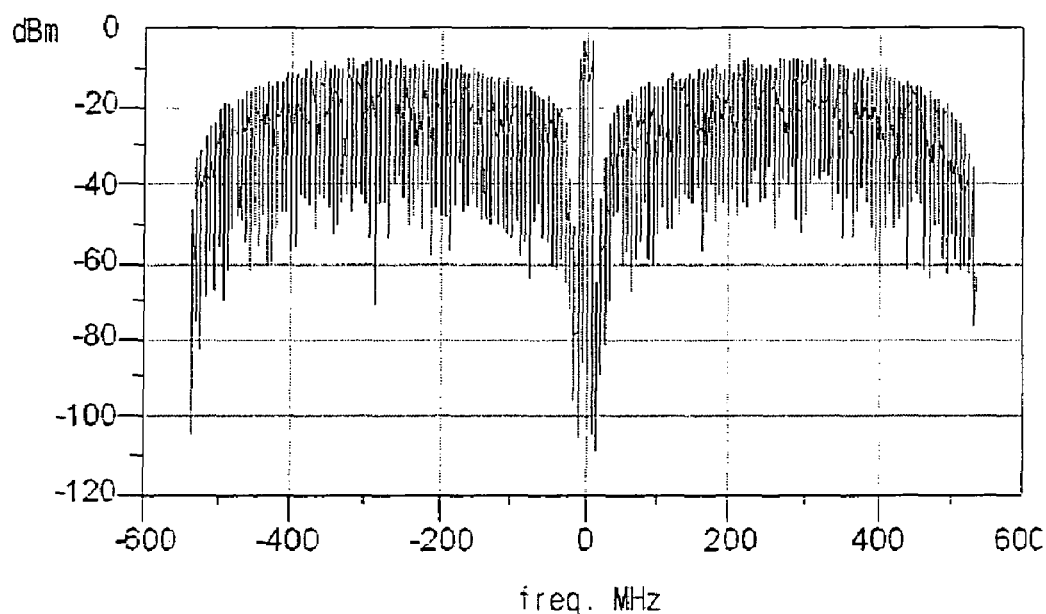
Figure 3C:
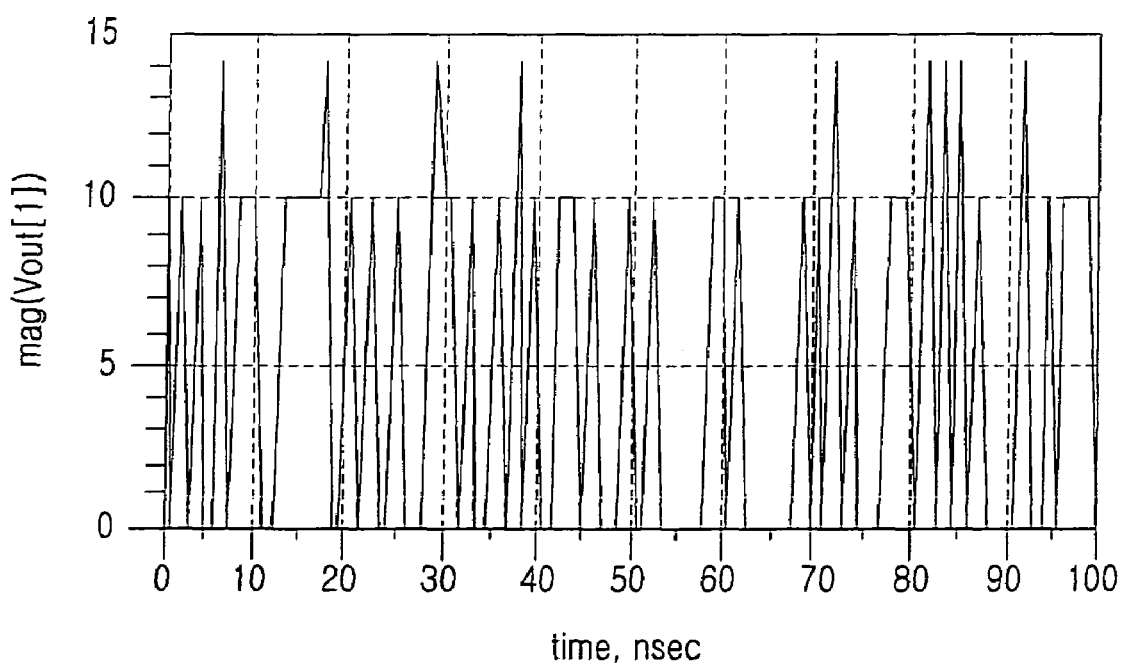

FIGS. 3A to 3C are diagrams illustrating frequency and time domain characteristics of an input signal to a power amplifier based on a phase delay in a power amplification system according to the present invention. FIGS. 3A to 3C show the simulation results for four available 2.14 GHz Wideband Code Division Multiple Access (WCDMA) channels, i.e. four Frequency Assignment (FA) signals, for the case where a baseband delta-sigma modulator is used.

Referring to FIG. 3A, there is shown a signal magnitude in the frequency and time domains when the phase delay is a multiple of 360° in the basic bandwidth. That is, FIG. 3A shows the simulation results on the signal magnitude in the frequency spectrum and the time domain for the signal input to the transistor 209 when the phase delay between the source device 201 and the transistor 209 is a multiple of 360° in the bandwidth of the delta-sigma modulated basic signal.

From the time-domain graph of FIG. 3A, it can be noted that the signal magnitude has a constant level. In FIG. 3A, the frequency spectrum represents the delta-sigma modulated basic signal, the signal in the center represents the original input signal of WCDMA 4FA, and both outer band signals represent the quantization noise generated during delta-sigma modulation.

The signal shown in FIG. 3A is equivalent to an output signal source of the delta-sigma modulated signal source, i.e. an output signal of the source device 201. Therefore, it can be noted that the delta-sigma modulated signal is delivered to the transistor 209 without distortion.

Referring to FIG. 3B, there is shown a signal magnitude in the frequency and time domains when the phase delay is a multiple of 90° and 270° in the basic bandwidth. That is, FIG. 3B shows the simulation results on the signal magnitude in the frequency spectrum and the time domain for the signal input to the transistor 209 when the phase delay between the source device 201 and the transistor 209 is a multiple of 90° and 270° in the bandwidth of the delta-sigma modulated basic signal.

Referring to FIG. 3C, there is shown a signal magnitude in the frequency and time domains when the phase delay is a multiple of 180° in the basic bandwidth. That is, FIG. 3C shows the simulation results on the signal magnitude in the frequency spectrum and the time domain for the signal input to the transistor 209 when the phase delay between the source device 201 and the transistor 209 is a multiple of 180° in the bandwidth of the delta-sigma modulated basic signal.

From FIGS. 3B and 3C, it can be noted that the original signal of WCDMA 4FA remains unchanged in the frequency spectrum. It can also be noted that even though the original signal of WCDMA 4FA remains unchanged, a pattern of the quantization noises changes as shown in FIG. 3A. As a result, the signal magnitude cannot remain constant in the time domain as shown in FIGS. 3B and 3C. This is because an aliasing effect occurs between the basic signal and both harmonic signals of the basic signal, shown in FIGS. 3B and 3C. In this phenomenon, signal distortion is maximized when the phase delay is 180° with respect to a bandwidth of the basic signal as shown in FIG. 3C. The signal input to the amplifier is a square wave having only On-Off information, and the square wave has broadband characteristics. Therefore, the input signal suffers a different phase delay according to its frequency, and the delta-sigma modulated signal is distorted due to the phase delay. From FIG. 3A in which the phase delay is a multiple of 360°, it can be noted that the signal magnitude remains unchanged for the On time as shown in the time-domain characteristic graph. However, from FIGS. 3B and 3C in which the phase delay is 90° or 180°, it can be noted that the signal magnitude greatly changes for the On time as the signal is distorted. In conclusion, in order to deliver the delta-sigma modulated broadband signal to the transistor in the power amplifier without distortion, it is necessary to match the overall phase delay to a multiple of 360° for the bandwidth of the basic signal, using the broadband input matching circuit for the transistor and the phase compensation circuit such as the additional aliasing line.

As can be understood from the foregoing description, the amplification system using the delta-sigma modulator includes the phase compensation circuit and the input matching circuit, making it possible to deliver the constant envelope signal delta-sigma modulated by the delta-sigma modulator to the power amplifier in the amplification system without distortion. By delivering the constant envelope signal to the power amplifier without distortion, it is possible to omit a linear amplification process of the power amplifier, contributing to an increase in efficiency of the power amplifier. The increase in the efficiency of the power amplifier contributes to achievement of the delta-sigma modulation system for high efficiency and improvement of the high-efficiency amplification system.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An apparatus for power amplification in a communication system, the apparatus comprising:
   a phase compensation circuit for removing an aliasing effect by phase-delaying a delta-sigma modulated signal according to a predetermined phase delay to provide a phase-compensated signal; and
   a power amplifier for receiving the phase-compensated signal, and amplifying the phase-compensated signal.

2. The apparatus of claim 1, wherein the phase delay is a multiple of 360° for a bandwidth of a basic signal of the delta-sigma modulated signal.

3. The apparatus of claim 1, wherein the power amplifier includes an input matching circuit for performing matching on the phase-compensated signal.

4. The apparatus of claim 1, wherein the phase compensation circuit uses one of an aliasing line, a coaxial line, a micro-strip line, and a lumped component.

5. A method for power amplification in a communication system, the method comprising the steps of:
   receiving a delta-sigma modulated signal;
   removing an aliasing effect by phase-delaying the delta-sigma modulated signal to provide a phase-compensated signal; and
   power-amplifying the phase-compensated signal.

6. The method of claim 5, wherein the phase delaying step comprises performing phase delay to provide a multiple 360° for a bandwidth of a basic signal of the delta-sigma modulated signal.

7. An apparatus for power amplification in a communication system, the apparatus comprising:
   a phase compensation circuit for receiving a delta-sigma modulated signal, and applying a first phase delay to the delta-sigma modulated signal; and
   an input matching circuit for receiving the first phase delay-applied signal, and applying a second phase delay to the first phase delay-applied signal to output a signal for power amplification.

8. The apparatus of claim 7, wherein the apparatus phase-delays the delta-sigma modulated signal by a multiple of 360° for a bandwidth of a basic signal of the delta-sigma modulated signal through the first and second phase delays.

9. The apparatus of claim 7, wherein the phase compensation circuit removes an aliasing effect through the first phase delay.

10. The apparatus of claim 7, wherein the phase compensation circuit uses one of an aliasing line, a coaxial line, a micro-strip line, and a lumped component.

11. The apparatus of claim 7, wherein the input matching circuit matches an input signal for signal amplification through the second phase delay.

12. The apparatus of claim 7, wherein the input matching circuit includes the phase compensation circuit.

13. The apparatus of claim 7, further comprising a transistor for amplifying the second phase delay-applied signal.

14. A method for power amplification in a communication system, the method comprising the steps of:
   receiving a delta-sigma modulated signal;
   applying a first phase delay to the delta-sigma modulated signal; and
   applying a second delay to the first phase delay-applied signal and amplifying the second phase delay-applied signal.

15. The method of claim 14, wherein the delta-sigma modulated signal is phase-delayed by a multiple of 360° for a bandwidth of a basic signal of the delta-sigma modulated signal through the first and second phase delays.

16. The method of claim 14, wherein the first phase delay serves to remove an aliasing effect.

17. The method of claim 14, wherein the second phase delay serves to match an input signal for signal amplification.

* * * * *